United States Patent [19]

Meyer

[11] Patent Number: 5,802,115
[45] Date of Patent: Sep. 1, 1998

[54] CONVOLUTION DECODER USING THE VITERBI ALGORITHM

[75] Inventor: Jacques Meyer, Corenc, France

[73] Assignee: SGS-Thomson Microelectronics S.A., Saint Genis, France

[21] Appl. No.: 697,406

[22] Filed: Aug. 23, 1996

[30] Foreign Application Priority Data

Aug. 31, 1995 [FR] France ................... 95 10402

[51] Int. Cl.$^6$ .................... H03D 1/00; H04L 12/50; H04L 12/66; G06F 11/10

[52] U.S. Cl. .................... 375/341; 370/358; 370/353; 371/43.4

[58] Field of Search .................... 375/341, 340, 375/362; 371/43.4, 43.7, 43.8; 370/392, 358, 353, 230, 416

[56] References Cited

U.S. PATENT DOCUMENTS

4,905,317  2/1990  Suzuki et al. .................... 371/43.4
5,530,707  6/1996  Lin .................... 371/434.4

*Primary Examiner*—Chi H. Pham
*Assistant Examiner*—Khai Tran
*Attorney, Agent, or Firm*—Wolf, Greenfield & Sacks, P.C.

[57] ABSTRACT

A convolution decoder includes, for each state S of a shift register receiving an initial signal, an add-compare-select circuit which provides a one-bit decision for selecting either one of states 2S or 2S+1 as a state preceding the current state S. A decoding element traces back the memory according to a path indicated by the decisions stored in the memory in order to restore the succession of states of the initial signal. Each calculation cell associated with a state S further includes means for establishing a complex R-bit decision comprising, by decreasing weight, the one-bit decision of the calculation cell and the R-1 most significant bits of the complex decision established by the cell associated with the selected state 2S or 2S+1.

28 Claims, 4 Drawing Sheets

|   | A(M1) | B(M2) | C(M1) | D(M2) |
|---|---|---|---|---|
|   | W |   |   |   |
|   |   | W |   |   |
|   |   | TB | W |   |
|   | TB/D |   | TB | W |
|   | W |   |   | TB |
|   |   | TB/D |   |   |
|   | TB | W |   |   |
|   |   |   | TB/D |   |

Fig 7

|   | A(M1) | B(M2) | C(M1) | D(M2) | E(M1) | F(M2) | G(M1) | H(M2) |
|---|---|---|---|---|---|---|---|---|
|   | W |   |   |   |   |   |   |   |
|   |   | W |   |   |   |   |   |   |
|   |   |   | W |   |   |   |   |   |
|   |   |   |   | W |   |   |   |   |
|   |   |   |   | TB | W |   |   |   |
|   |   |   | TB |   | TB | W |   |   |
|   |   | TB |   | TB |   | TB | W |   |
|   | TB/D |   | TB |   | TB |   | TB | W |
|   | W | TB/D |   | TB |   | TB |   | TB |

Fig 8

CONVOLUTION DECODER USING THE VITERBI ALGORITHM

BACKGROUND OF THE INVENTION

1. Field of the Invention

The present invention relates to convolutional decoders using the Viterbi algorithm. Convolutional encoding is used for transmissions of data in order to decrease probabilities of errors.

2. Discussion of the Related Art

Figure 1:
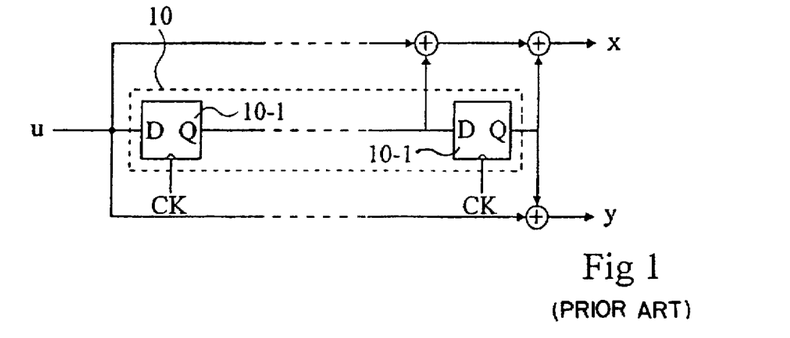
FIG. 1, above described, represents a conventional convolutional encoder.

FIG. 1 illustrates a conventional convolutional encoder. A binary signal u is provided to an encoding shift register 10 including a plurality of cascaded flip-flops 10-1 timed by a clock CK. The frequency of clock CK is normally equal to the transmission frequency of the bits by signal u. From the states of flip-flops 10-1, two signals x and y representing the encoded signal u are established. Each signal x and y is obtained by summing (Exclusive-ORing) the input u of the shift register, the output of the shift register, and intermediate states of the shift register, wherein the intermediate states are generally different for signals x and y.

Figure 2:
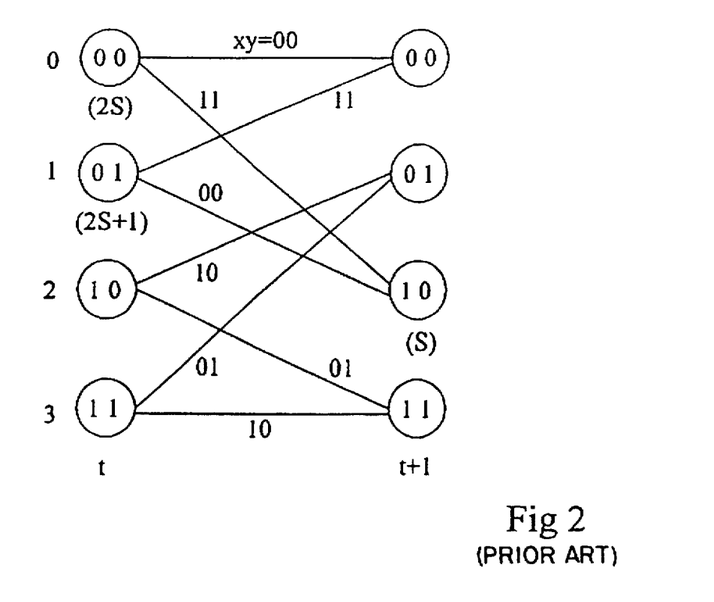
FIG. 2, above described, represents a 4-state trellis in a convolutional decoding.

FIG. 2 represents an exemplary graph, referred to as a trellis, illustrating the possible transitions of the states of the shift register at two consecutive times t and t+1, as well as the corresponding values of signals x and y. This example corresponds to a 4-state trellis (i.e., the encoding shift register includes two flip-flops), signal x being the sum of signal u and of the outputs of all the flip-flops and signal y being the sum of signal u and of the output of the shift register. The possible states of the shift register are represented in binary values insides circles and in decimal values 0, 1, 2 and 3. To avoid confusion between binary and decimal values, the binary values are followed by the letter "b" in the following description. The binary values of signals x and y are written on links between two circles which represent possible transitions. Thus, for example, when the shift register passes from state 00b (0) to state 10b (2), then xy=11b.

Due to the shift register's properties, a state S can be reached only from the preceding state 2S or 2S+1 (modulo the number N of possible states). For example, state 2 (10b) can be reached only from the preceding state 0 (00b) or 1 (01b). If one of the two possible transitions provides bits x and y, the other transition provides the complementary bits x* and y*.

Convolutional decoding consists of recovering in a specific way the successive states of the encoding shift register and thereby the transitions of the initial signal, as a function of the bits x and y that are received.

Each time a pair of bits x and y is received, a cost, usually named a metric, is calculated for each possible link between the states and corresponds to the inverse of the probability for the transition represented by the link to occur. For example, in FIG. 2, if the pair of bits 00 is received, the links designated by 00b have a metric 0, the links designated by 10b and 01b have a metric 1, the links designated by 11b have a metric 2. Then, for each possible state, among the two links provided thereto, the link with the smallest metric is selected, in the form of a stored decision. More precisely, to determine whether a state S is related to a preceding state 2S or 2S+1, one compares the sum of the metrics of the previously selected links which enabled the system to reach state S through state 2S with the sum of the metrics of the previously selected links which enabled the system to reach state S through state 2S+1. Then, it is the smallest sum of metrics which determines the current link to select.

Figure 3:
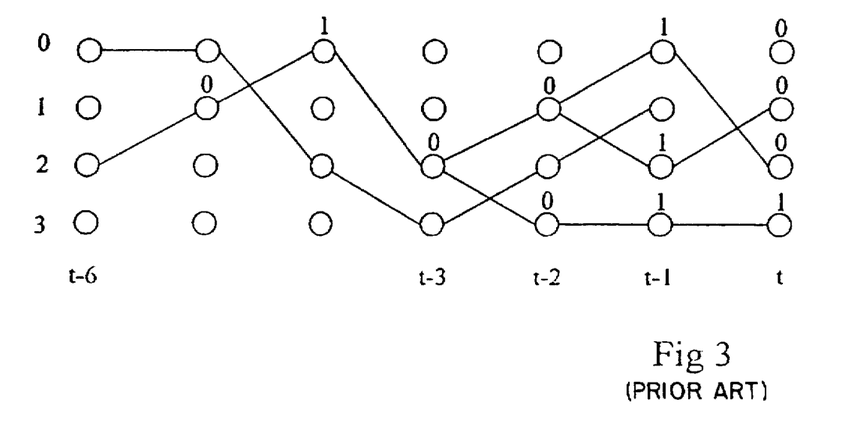
FIG. 3, above described, is an exemplary illustration of the convolutional decoding method.

FIG. 3 represents an exemplary structure of links at consecutive times for a 4-state trellis (FIG. 2). Each of the four new states associated with a pair of bits x and y that have just been provided is related to a single preceding state, as shown at time t. Over time, prior states, like state 1 at time t-1, have no further successors, i.e., they are no longer related to a new state. Then, the successive links that were selected up to such a successorless state disappear. When enough time has elapsed, there remains a single path which interconnects successive prior states, as between times t-3 and t-6, toward which all the paths at the current time t converge. It is this single path, prior to time t-3, which interconnects the successive states taken by the shift register, and which therefore enables the system to restore the transitions of the initial signal u.

The successively stored decisions are used to find this single path. For this purpose, one starts from any of the four stored decisions at current time t and the decisions are traced back, i.e., examined in the inverse order of their storing. For example, the decision associated with state 1 in FIG. 3 is 0 and points at state 2 of time t-1, whose decision (1) points at state 1 of time t-2, and so on.

To be able to find the single path which will restore the states of signal u, the decisions must be traced back for a sufficient length of time, also called convergence length, which depends upon the number N of possible states. Decoding, i.e. restoring the states of signal u, can start only when the convergence length is reached. Decisions continue to be traced back during decoding. Since the states of signal u are restored in an inverse order, the initial order is subsequently reestablished by an inversion memory.

Figure 4:
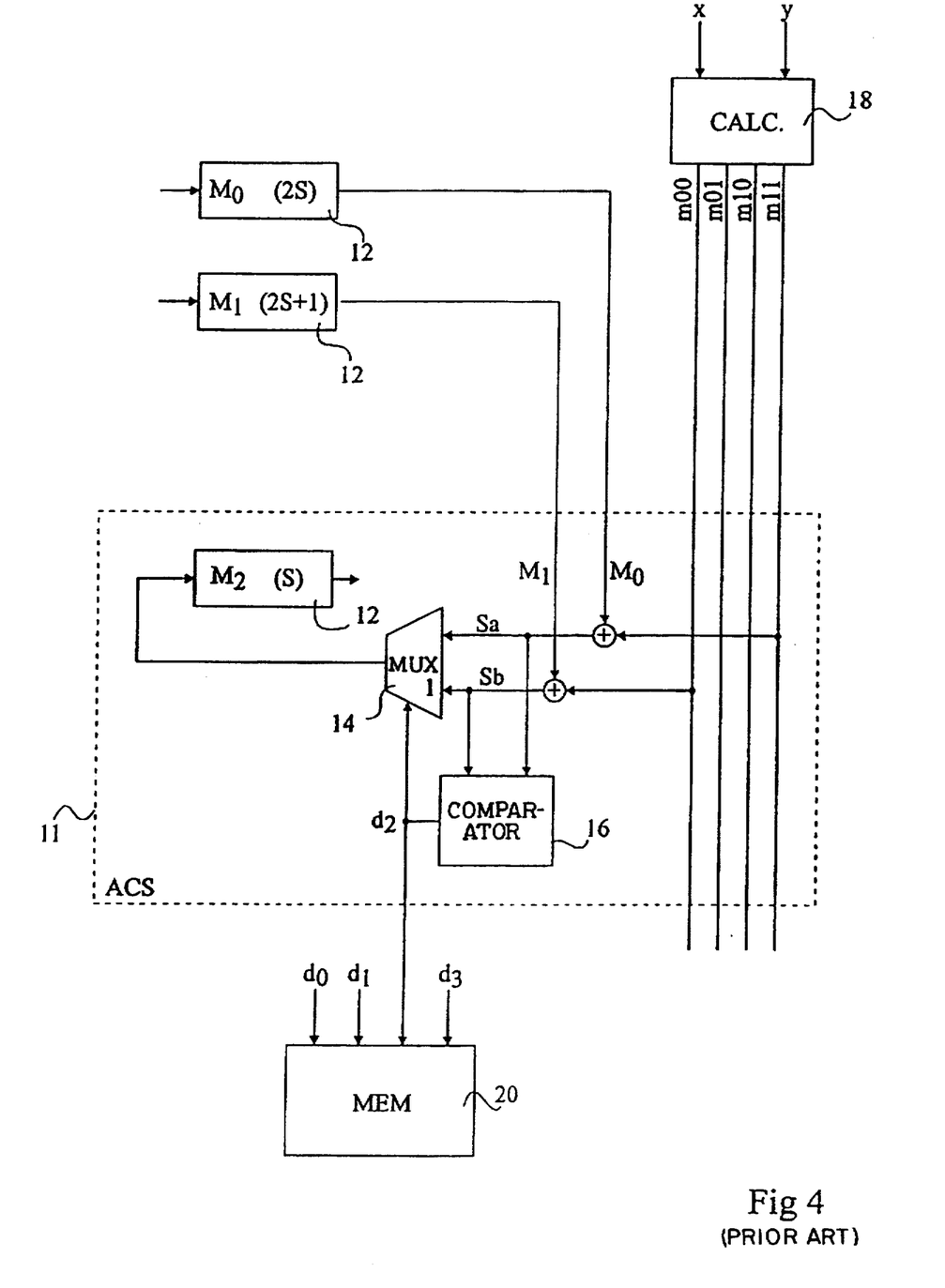
FIG. 4, above described, partially represents a conventional convolutional decoder.

FIG. 4 partially represents a conventional convolutional decoder for a 4-state trellis (FIG. 2). With each state is associated an add-compare-select (ACS) cell 11, only one of which, associated with state 2, is represented. Each ACS cell includes a register 12 that stores the sum M of the metrics of the links arriving at the corresponding state. Each register 12 receives the output of a multiplexer 14 which is controlled by the one-bit decision d established by the ACS cell. The decision d is provided by a comparator 16 which compares sums Sa and Sb which are provided to the inputs of multiplexer 14. For the shown ACS cell, associated with state 2, the sum Sa is equal to the sum of content $M_0$ of the register 12 associated with state 0 and of the metric m11 of the link between the current state 2 and the preceding state 0. Sum Sb is equal to the sum of content $M_1$ of the register 12 associated with state 1 and of the metric m00 of the link between the current state 2 and the preceding state 1. Comparator 16 selects, with multiplexer 14, the smallest of values Sa and Sb, the decision d provided by comparator 16 being at 1 if value Sb is smaller than Sa.

Generally, an ACS cell associated with a state S uses the contents of the registers 12 associated with states 2S and 2S+1 and the two metrics m associated with the links between state S and the preceding states 2S and 2S+1. The two necessary metrics m are provided by a circuit 18 which calculates the four possible metrics m00, m01, and m11 from the bits x and y that are received.

In a simple convolutional decoder, i.e. having a trellis with a small number of states, the convergence length is also small. The decisions established by the ACS cells are then stored in decision registers having a size equal to the convergence length. The contents of the decision registers are controlled according to the so called "Register Exchange" method. With this method, the least significant bits of each decision register, whose content is modified at each reception of a new pair of bits x and y, directly indicate a new state in the single path. For example, in FIG. 3, the decision register associated with state 1 contains, at time t, the value 010010 and the two least significant bits 10 indicate the state 2 at time t-6.

In present conventional applications of convolutional decoders, the trellis may have 64 states. The convergence length is then approximately 120 cycles or bits, which requires 64 120-bit decision registers for the use of the register exchange method. This is no longer possible because of size and cost requirements. In this case, the decisions d provided by all the ACS cells are stored in a memory 20 (FIG. 4).

Figure 5:
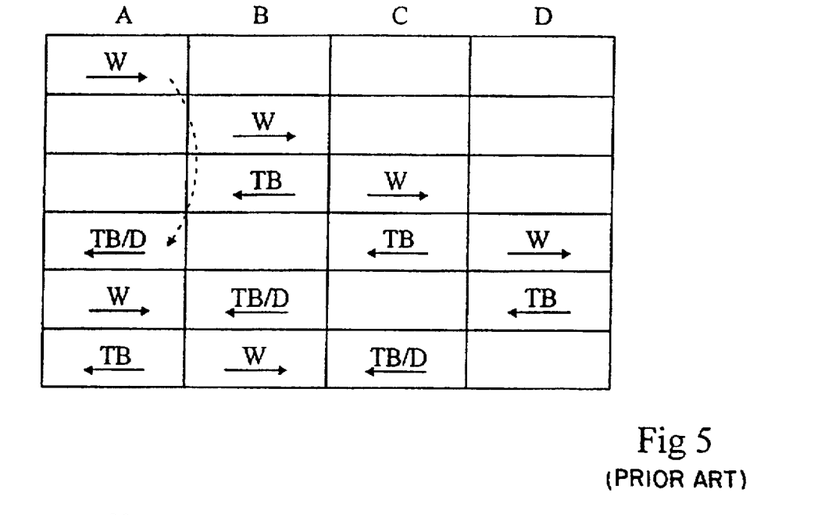
FIG. 5, above described, represents the organization of a memory used in a conventional convolutional decoder.

As shown in FIG. 5, memory 20 is in fact formed by four memories A, B, C and D, each of which has a size of L N-bit words, where L is the convergence length and N is the size of the trellis. The decisions are written (W) circularly in memories A to D, i.e. memories A to D are successively filled and, when memory D is filled, filling resumes at memory A. The decoding process of the decisions stored in memory A is illustrated by an arrow in dotted lines. Once memory A has been filled, memory B is then also filled. When memory B has been filled, the decisions stored in this memory are traced back (TB). This tracing back is achieved from any one of the N last decisions stored in memory B. When the beginning of memory B is reached, it is ensured that the decisions indicate the single path. Then, the decisions are further traced back in memory A and the states found on the path indicated by the traced back decisions are decoded at the same time (TB/D).

For each pair of values x and y, one decision is written in memory, the memory is read to trace back one decision, and the memory is read to decode one decision, while a series of decisions awaits decoding. Since it is desired to operate as fast as possible, the three memory accesses are simultaneous. Accordingly, four distinct memories are necessary.

The operation frequency of the convolutional decoder, especially of the ACS cells and memories, is equal to the transmission frequency of signals x and y, i.e. to the frequency of clock CK which times the encoding shift register 10. Conventional transmission frequencies are approximately 60 MHz, which is practically the limit of the operation frequency of current inexpensive memories. Of course, it is desirable to increase the transmission frequency without using faster memories which are significantly more expensive.

A solution to double the transmission frequency without doubling the memory speed is proposed in an article of IEEE journal of Solid-State Circuits, vol. 27, No. 12, December 1992 "A 140-Mb/s, 32-State, Radix-4 Viterbi Decoder". This article proposes ACS cells which calculate 2-bit decisions at half the transmission frequency. Each 2-bit decision enables the system to trace back a decision established two cycles earlier and thus to read in the memory at half-speed. In contrast, to write in the memory also at half-speed, the N 2-bit decisions should be simultaneously written in the memory. As a consequence, the size of the memory bus must be doubled. The principle used to calculate the 2-bit decisions is to consider, instead of the two links of a current state S with the two preceding states 2S and 2S+1, the four links between the state S and the states 4S, 4S+1, 4S+2 and 4S+3 (modulo N) which precede the states 2S and 2S+1. Radix-4 means that four links arriving at each state are taken into account. As a result, each ACS cell must carry out six comparisons to find the lowest metric sum among four, instead of a single comparison. It has proven that the complexity of the decoder increases by a factor higher than 2.

SUMMARY OF THE INVENTION

An object of the present invention is to provide a convolutional decoder adapted to operate at a high speed without increasing the operation speed of the memory, while being relatively simple.

A further object of the present invention is to provide such a convolutional decoder which allows a decrease in the size of the memory.

To achieve these objects, the present invention provides, in each ACS cell, a decision register including a plurality of bits which are up-dated according to the "register exchange" method. As compared with the conventional register exchange method, the decision registers of the ACS cells according to the present invention have a size R of a few bits only and that will never reach the convergence length. Each time the contents of the decision registers have been totally replaced, i.e. when they contain new complex decisions, these decisions are written in a memory where they are read again for trace back at a frequency inversely proportional to their size R. The writing frequency in the memory is inversely proportional to the size of the write bus, which is only limited by fabrication constraints of the bus in an integrated circuit.

The ACS cells according to the present invention establish the successive bits of complex decisions at the rate of one bit per cycle and thus operate at the transmission frequency that is desired to be increased. This is not a drawback because the operation frequency of the decoder is mainly limited by the operation frequency of the memory and not by the frequency of the ACS cells. Conventional techniques enable fabrication of such logic circuits operating at frequencies significantly higher than the memory frequency.

The invention more particularly aims at providing a convolutional decoder receiving two encoded signals which are established from states of a shift register which receives an initial signal and is timed by clock cycles. The decoder includes a plurality of decision calculation cells, each respectively associated with all of the possible states S of the shift register. Each cell associated with a current state S includes an add-compare-select (ACS) circuit which, from using current values of the two encoded signals, provides a one-bit decision for selecting either one of states 2S or 2S+1 as a state preceding the current state S. A memory stores the successive decisions and a decoding element traces back through the memory according to a path indicated by the decisions stored in the memory in order to restore the succession of states of the initial signal. Each calculation cell associated with a state S further includes a means for establishing a complex R-bit decision comprising, by decreasing weight, the onebit decision of the calculation cell and the R-1 most significant bits of the complex decision established by the cell associated with the selected state 2S and 2S+1.

According to an embodiment of the present invention, the decoder includes a formatting circuit for transferring complex decisions in the memory at a rate adapted to the size of a write bus of the memory.

According to an embodiment of the present invention, the shift register has N possible states and the memory includes a kN-bit write bus. The decoder is operative to store the N R-bit complex decisions simultaneously in the formatting circuit every R cycles and to provide these decisions to the memory at the rate of one kN-bit word every k cycles.

According to an embodiment of the present invention, the memory includes two memories, each of which is partitioned into R/k areas (R>k) having a size NL/((R/k)−1), where L is the number of one-bit decisions that must be traced back before reaching values that can be decoded. The decoder is operative to alternately write decisions in the two memories at the rate of one write operation every k cycles so as to circularly fill all the areas, and to carry out the read operations necessary for the trace back of the decisions in the areas of the memory which have not been written, at the rate of one read operation every k cycles.

The foregoing and other objects, features, aspects and advantages of the invention will become apparent from the following detailed description of the present invention when taken in conjunction with the accompanying drawings.

DETAILED DESCRIPTION OF THE PREFERRED EMBODIMENTS

Figure 6:
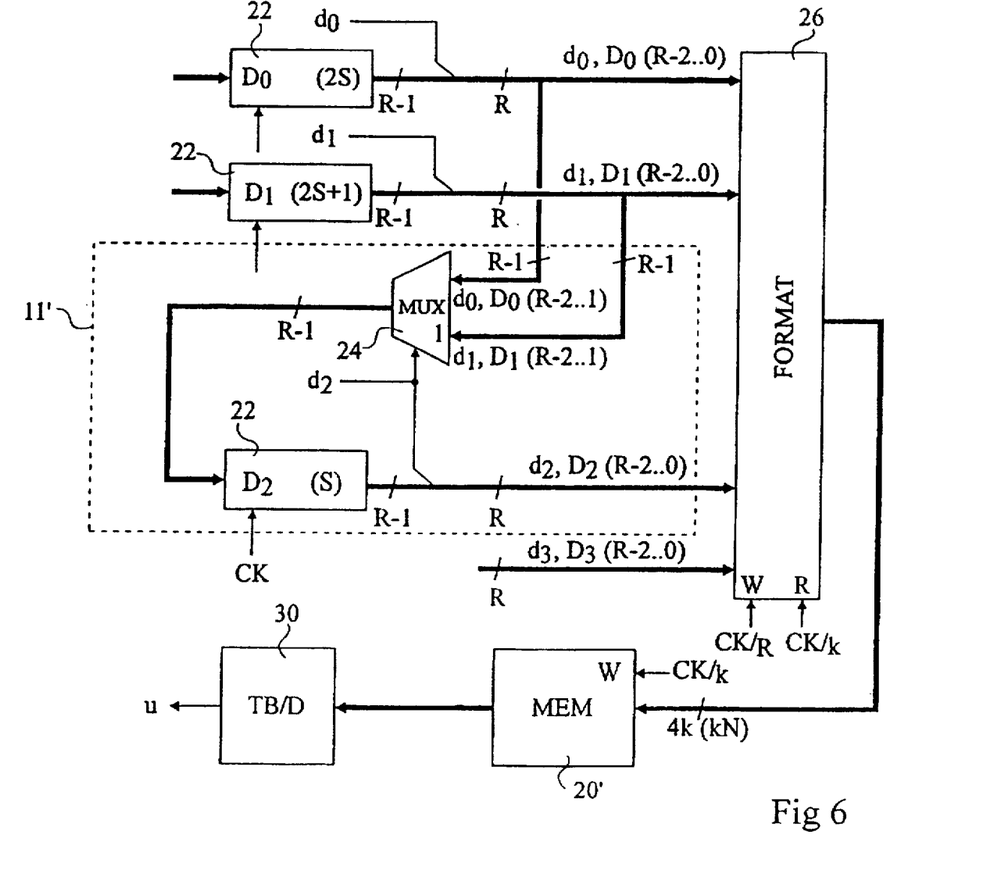
FIG. 6 partially represents an embodiment of a convolutional decoder according to the present invention for a 4-state trellis.

FIG. 6 represents a modification made, according to the present invention, to a conventional convolutional decoder shown in FIG. 4, in the case of a 4-state trellis (FIG. 2). A convolutional decoder according to the present invention includes all the elements of the conventional convolutional decoder of FIG. 4, which are not represented in FIG. 6 for the sake of clarity.

Each ACS cell includes, according to the present invention, an extension 11', which is shown in FIG. 6 only for the ACS cell associated with state 2. The extension 11' associated with an ACS cell establishes complex decisions of R bits from the one-bit decisions normally established by the ACS cells. A complex decision associated with a state is established according to the conventional register exchange method, except that the number R of bits is small with respect to the convergence length (number R is preferably selected among values 2, 4 and 8). The complex decisions are stored in a memory 20', so as to be traced back through the necessary convergence length.

Each complex decision allows the trace back, in a single cycle, of the decision established R cycles earlier. Thus, the read rate of memory 20' can be decreased by a factor R, provided that at least one complex decision can be read during one cycle (the width of the memory read bus is of at least R bits). The writing rate of memory 20' depends only upon the width of its write bus. If this width is kN bits (where N is the size of the trellis and k is an integer, preferably a power of 2), a write operation is achieved every k cycles, since a rate of N one-bit decisions per cycle must be complied with. Thus, the value of k is selected to obtain a trade-off between the desired reduction of the write frequency and the complexity in realizing the memory bus.

Each extension 11' includes an (R-1)-bit decision register 22 which loads, at each clock cycle CK, the output of a multiplexer 24 controlled by the decision ds, where S is a state (0–3), established by the associated ACS cell. A first input of multiplexer 24 associated with state 2 receives, by order of decreasing weight, the one-bit decision do established by the ACS cell associated with state 0 as well as the R-2 most significant bits of the decision register 22 associated with state 0. A second input of multiplexer 24 receives the one-bit decision $d_1$ established by the ACS cell associated with state 1 and the R-2 most significant bits of the decision register 22 associated with state 1. The high level of the one-bit decision $d_2$ associated with state 2 selects the second input of multiplexer 24, i.e. the bits associated with state 1. The R-bit complex decision associated with state 2 is obtained by juxtaposing the one-bit decision $d_2$, as the most significant bit, to the output of the associated register 22.

Generally, an extension 11' associated with a state S establishes an R-bit complex decision at each clock cycle CK. This complex decision comprises, by order of decreasing weights, the one-bit decision $d_S$ established by the ACS cell and the R-1 most significant bits of the complex decision established by the extension 11' that is associated with the state 2S or 2S+1 selected by the one-bit decision $d_S$.

A complex decision is modified at each clock cycle and allows, at each cycle, to trace back a decision established R cycles earlier. Thus, it is sufficient to store the N complex decisions associated with the N states every R cycles. To directly achieve this storage, the memory bus must be RxN bits wide, and in this case, a write operation is achieved every R cycles.

However, the number N is often relatively high, for example 64. It is preferred to limit the bus width to 128 bits in order to reduce the complexity of the integration of the bus.

In practice, the width of the memory bus is selected equal to kN bits, where k is smaller than R and at least equal to 2. In this case, a formatting circuit 26 is provided between memory 20' and the decision register 22, which transfers the complex decisions into memory 20' at a suitable rate. The formatting circuit 26 is, for example, a parallel-to-series converter in which N R-bit complex decisions are simultaneously written at the rate of one write operation every R cycles (CK/R) and in which the N decisions are read in R/k words of kN bits at a rate of one read operation every k cycles (CK/k).

To trace back the complex decisions in memory 20', a decoding circuit 30 operates as follows. Any one of the N last stored decisions, for example the first one, is selected to start. If the number R of bits is sufficient for encoding the N states, the least significant bits of each complex decision directly point at one of the N previously stored decisions. If the number R is insufficient, each complex decision is widened, at its most significant level, by the least significant bits of the state associated with the decision.

Since each decision allows tracing back a decision established R cycles earlier, the reading rate of memory 20' is one decision every R cycles, independently of the size of the memory bus. If the memory bus is such that several decisions are read at the same time, the preceding decision, completed by the least significant bits of the associated state, indicates which one of the simultaneously read decisions is to be selected.

As outlined in the above description, the reading and writing rates of memory 20' can be independently adjusted. In contrast, the ACS cells 11 and their extensions 11' operate at the clock frequency CK which is the transmission frequency. This is not impairing because it is generally the minimum access time of the memory which limits the operation frequency of the decoder, since present techniques allow easy fabrication of the other elements of the decoder so that they operate at frequencies significantly higher than the maximum access frequency of the memories.

In a convolutional decoder according to the present invention, with R=2 and k=2, the decision registers 22 and the formatting circuit 26 are omitted, and similar characteristics as a conventional Radix-4 decoder are obtained with a significantly smaller complexity.

Additional optimizations can be obtained with values of R higher than 2.

Figure 7:
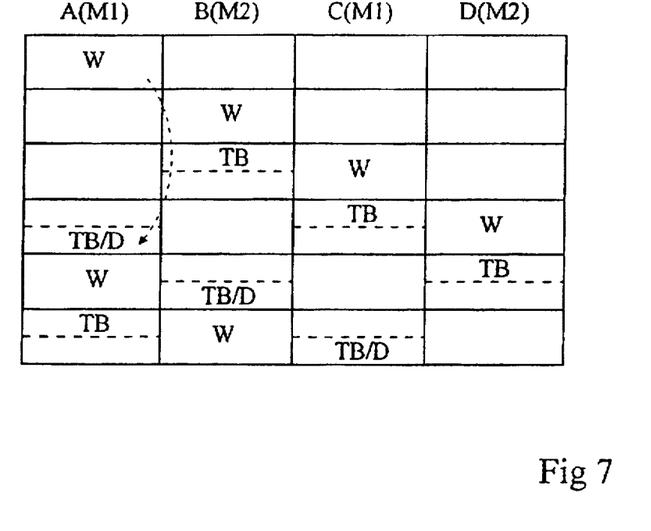
FIG. 7 represents a first exemplary organization of the memory of a convolutional decoder according to the present invention.

FIG. 7 illustrates an organization of memory 20' when R=4 and k=2. Normally, in this case, the memory is written every two cycles and read every four cycles. In practice, the reading rate does not need to be slower than the writing rate since the memory must be adapted to withstand the faster of the two rates.

According to an embodiment of the present invention, the difference between the writing rate and the reading rate is exploited to decrease the number and size of the necessary memories.

In the example of FIG. 7, only two memories M1 and M2 are used. Memory M1 is partitioned into two areas A and C, and memory M2 is partitioned into two areas B and D. Each of these areas includes L/2 2N-bit words (where L is the convergence length). As in FIG. 5, areas A–D are circularly filled (W). In contrast, each of the areas is filled in L/2 write operations instead of L write operations as in FIG. 5. During the filling of area C, the decisions contained in area B are traced back (TB) to reach area A in order to trace back and to decode (TB/D) the content of area A. Since each decision allows tracing back four cycles, area B is traced back in L/4 cycles, i.e. when one half of area C is filled, the tracing back of area B is completed. This is represented by reference TB located in the upper half of a rectangle separated by a dotted line.

While area D is being filled, there is enough time to trace back area C in order to reach the data to be decoded in area B (which is illustrated by reference TB in an upper half-rectangle) and, to trace back and to decode area A (which is illustrated by reference TB/D in the lower half-rectangle). This allows storing areas C and A in the same memory M1, since areas C and A no longer need to be traced back at the same time, as in the case of FIG. 5, but can be traced back successively while area D is filled. Generally, the two areas of the same memory are traced back while writing in an area of the other memory.

This embodiment uses only two memories instead of the four memories that were conventionally needed, the full size of the memory being unchanged. Decreasing the number of memories decreases in proportion the number of required address decoders and the corresponding surface.

Figure 8:
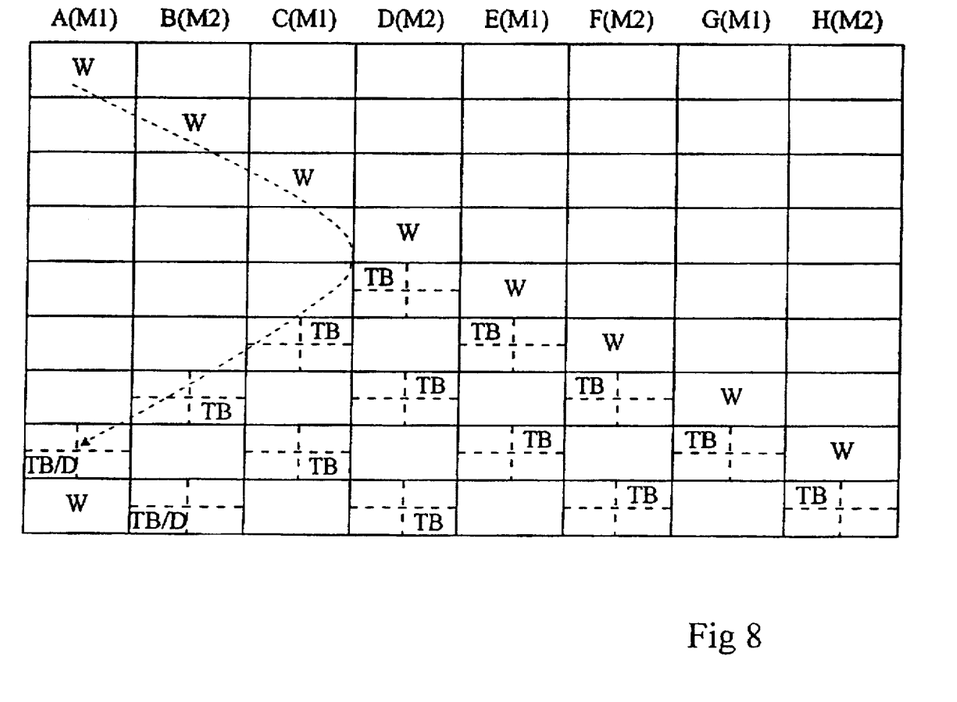
FIG. 8 represents a second exemplary organization of the memory of a convolutional decoder according to the present invention.

FIG. 8 illustrates a memory organization according to the present invention when R=8 and k=2. The memory is organized in eight areas A to H. Areas A, C, E and G belong to memory M1 and areas B, D, F and H belong to memory M2. Each area includes L/6 2N-bit words. The total size of the memory is thus 8NL/3 bits instead of 4NL bits in FIG. 7, which results in a global memory saving of 33%.

Areas A–H are circularly filled (W) as previously, each area being filled in L/6 write operations. Before decoding the content of area A, decisions must be traced back over L cycles, i.e. the next three memory areas B, C, D must have been filled. The trace back (TB) of area D begins while writing is achieved in area E. Since each decision enables to trace back 8 cycles, each area is traced back four times faster than the writing rate (which is of one write operation every two cycles). This is indicated by dotted lines which split each of the rectangles corresponding to a trace back phase into four portions. Thus, while area H is being filled in memory M2, there is enough time to successively trace back areas G, E, C and A of memory M1. The trace back of area G corresponds to the trace back of the first third of the decisions which must be traced back to decode the content of area D. The trace back of area E corresponds to the trace back of the second third of the decisions that must be traced back to decode area C. The trace back of area C corresponds to the trace back of the last third of the decisions that must be traced back to decode the content of area B. Finally, area A is traced back and decoded at the same time (TB/D).

Generally, the higher the ratio R/k, the more memory is saved. For an arbitrary number R, preferably equal to a power of 2, two memories are used, each of which is partitioned into R/k areas of NL/((R/k)−1) bits. Before decoding the content of an area, the next (R/k)−1 areas are traced back, and while an area of a memory is written into, R/k areas are traced back in the other memory. The reading and writing rates are then identical and equal to a k-th of the transmission frequency CK.

In the case where the operations for reading a decision and calculating the address of the preceding decision cannot be ended before the next reading operation, the reading operations of the areas of a same memory are interlaced while the other memory is written into. In other words, for example, one decision is successively read in areas A, C, E, and G, which leaves for calculating an address between two decisions of the same area, the time spent for reading the three other areas.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A convolution decoder receiving two encoded signals established from states of a shift register which receives an initial signal and is timed by clock cycles including:

a plurality of decision calculation cells respectively associated with possible states S of the shift register, wherein each cell associated with a current state S includes an add-compare-select circuit which, from current values of the two encoded signals, provides a one-bit decision for selecting either one of previous states 2S and 2S+1 as a state preceding the current state S;

a memory in which successive of the one-bit decisions are stored; and a decoding element for tracing back the memory according to a path indicated by the one-bit decisions stored in the memory in order to restore a succession of states of the initial signal;

wherein each decision calculation cell associated with a state S further includes means for establishing a complex R-bit decision, the complex R-bit decision comprising, by decreasing weight, the one-bit decision of the calculation cell and R-1 most significant bits of the complex R-bit decision established by the cell associated with one of the previously selected states 2S and 2S+1.

2. The convolution decoder of claim 1, including a formatting circuit for transferring the complex R-bit decisions to the memory at a rate adapted to a size of a write bus of the memory.

3. The convolution decoder of claim 2, wherein the shift register has N possible states and wherein the memory includes a kN-bit write bus, the decoder further including a means for storing the N R-bit complex decisions simultaneously in the formatting circuit every R cycles and to provide the decisions to the memory at a rate of one kN-bit word every k cycles.

4. The convolution decoder of claim 3, wherein the memory includes two memories, each of which is partitioned into R/k areas (R>k) having a size NL/((R/k)−1), where L is a number of one-bit decisions that must be traced back before reaching values that can be decoded, the decoder further including a means to alternately write decisions in the two memories at a rate of one write operation every k cycles so as to circularly fill all the areas, and to execute read operations necessary for a trace back of the decisions in the areas of the memory which are not being written too, at a rate of one read operation every k cycle.

5. The convolution decoder of claim 1, wherein the means for establishing a complex R-bit decision associated with a current state further comprises:

a first register for storing the complex R-bit decisions;

a first multiplexer, controlled by the one-bit decisions, the first multiplexer selects one of at least two inputs from the means for establishing a complex R-bit decision associated with preceding states 2S and 2S+1, wherein an output of the first multiplexer is connected to an input of the first register of state S, and the multiplexer supplies one of its two inputs to the first register of state S;

wherein one of the at least two inputs of the first multiplexer comprises, by decreasing weight, the one-bit decision of the decision calculation cell associated with state 2S and R-1 most significant bits of the complex R-bit decision stored in a first register associated with state 2S; and wherein the other of the at least two inputs of the first multiplexer comprises the one-bit decision of the decision calculation cell associated with state 2S+1 and R-1 most significant bits of the complex R-bit decision stored in a first register associated with state 2S+1.

6. The convolution decoder of claim 5, wherein the add-compare-select circuit associated with a current state S further comprises:

a second register for storing a sum of metrics of links leading up to the current state S;

a comparator for producing the one-bit decisions by comparing at least two sums, wherein one of the at least two sums comprises the sum of the register of a preceding state 2S and a metric of a link of the preceding state 2S, and another of the at least two sums comprises the sum of the register of a preceding state 2S+1 and a metric of a link of the preceding state 2S+1; and a second multiplexer controlled by the one-bit decisions from the comparator, for selecting one of the at least two sums which it receives as inputs, wherein an output of the second multiplexer is connected to an input of the second register, and the multiplexer supplies the selected sum to the second register.

7. The convolution decoder of claim 5, wherein an output of the second register is coupled to the memory.

8. The convolution decoder of claim 7, further comprising a formatting circuit connected between the memory and the output of the first register associated with each state.

9. The convolution decoder of claim 8, wherein the formatting circuit includes a means for obtaining the N R-bit complex decisions simultaneously every R cycles; and a means for transferring the N complex R-bit decisions to the memory at a rate of one kN bit word every k cycles.

10. The convolution decoder of claim 1, wherein the memory includes two memories, each of which is a single accessible area, the decoder including a means to alternately write decisions in the two memories at a rate of one write operation every 2 cycles so as to circularly fill all areas, and to execute read operations necessary for trace back of the decisions in areas of memory which are not being written to, at a rate of one read operation every 2 cycles.

11. The convolution decoder of claim 4 wherein R is a number selected from the numerical group comprising 2, 4 and 8, and R is greater than k.

12. The convolution decoder of claim 3, wherein the formatting circuit is a parallel-to-series converter.

13. The convolution decoder of claim 5, wherein the first multiplexer selects a smaller of the at least two inputs by the one-bit decision from the comparator.

14. The convolution decoder of claim 6, wherein the second multiplexer selects a smaller of the at least two sums by the one-bit decision from the comparator.

15. A decision calculation cell within a convolution decoder, comprising:

a decision circuit for selecting one of a plurality of inputs representing decisions of previous states of the convolution decoder prior to a present state, and for providing an indication of which one of the plurality of inputs was selected;

means for storing the input selected by the decision circuit; and means for combining the indication of which input was selected with the input selected by the decision circuit.

16. The decision calculation cell of claim 15, further comprising:

means for supplying a plurality of the combined indications and stored inputs to a memory after a predetermined number of states have been processed.

17. A decision calculation cell for a convolution decoder, comprising:

a compare circuit for comparing a plurality of inputs, wherein the inputs are groups of previously stored decisions of previous states, and having an output providing a decision of a current state:

a multiplexer, for selecting and providing as an output one of the plurality of inputs, wherein selection is made according to the decision of the current state from the compare circuit;

a register connected to receive and store the selected group of previously stored decisions from the output of the multiplexer; and a circuit that combines the selected group of previously stored decisions stored in the register with the decision of the current state from the compare circuit.

18. The decision calculation cell according to claim 17, further comprising:

a formatting circuit for supplying contents of the register to a memory, after a predetermined number of decisions have stored in the register.

19. A convolution decoder including a circuit for decoding a signal to determine the value of an initial signal encoded by a convolution encoder, comprising:

a register for storing decisions made as to which one of a plurality of states was a previous state of the convolution decoder;

a multiplexer controlled by a current decision wherein said current decision is based on a current state of the convolution decoder, the multiplexer selecting one of a plurality of inputs, each input being a combination of the contents of the register storing decisions made and a decision made in the previous state leading to the current state;

means for incorporating, into an output of the register, the current decision indicating which one of a plurality of states was the previous state to the current state of the convolution decoder, means for periodically transferring the contents of the register to a memory; and means for tracing back and decoding the memory to determine the original value of the initial signal.

20. A method of convolution decoding, comprising the steps of:

receiving two encoded signals representing a current state of an initial signal;

determining, based upon the two encoded signals, a decision for selecting one of a plurality of states as a state which preceded the current state;

storing the decision as part of a complex R-bit decision, said complex R-bit decision comprising previous decisions determined in previous states;

outputting the stored R-bit decision, every R cycles;

tracing back, via the complex R-bit decision, to determine a previous state of an initial signal, determined R cycles earlier.

21. The method of convolution decoding of claim 20, wherein the step of outputting further comprises: transferring complex decisions to a memory with a formatting circuit, at a rate adapted to a size of a write bus of the memory.

22. The method of convolution decoding of claim 21, wherein the transferring step further comprises:

receiving in parallel, a plurality of the stored R-bit decisions, every R cycles;

sending in series, portions of the plurality of stored R-bit decisions, every k cycles.

23. The method of convolution decoding of claim 21, wherein N possible states exist and wherein the memory includes a kN-bit write bus, further comprising the steps of:

storing the N R-bit complex decisions simultaneously in the formatting circuit every R cycle; and providing the decisions to the memory at a rate of one kN-bit word every k cycles.

24. The method of convolution decoding of claim 21, wherein the memory includes two memories, each of which is partitioned into R/k areas (R>k) having a size NL/((R/k) −1), where L is a number of one-bit decisions that must be traced back before reaching values that can be decoded, further comprising the steps of:

alternately writing decisions in the two memories, via the formatting circuit, at a rate of one write operation every k cycle so as to circularly fill all the areas, and performing read operations necessary to trace back the decisions in the areas of the memory which are not written to during a cycle, at a rate of one read operation every k cycle.

25. A method of storing a representation of states of a signal which has been encoded into bits representing states of a convolution encoder, comprising the steps of:

determining a decision which indicates a previous state is a predecessor state to a current state of the convolution encoder; and accumulating a plurality of the decisions in a register, by appending an indication of each decision which is determined for a current state to a current accumulated plurality of decisions in the register from previous states.

26. The method of claim 25, further comprising the step of:

transferring the accumulated plurality of stored decisions, when a count of accumulated decisions reaches a predetermined value which is less that a convergence length value of the convolution encoder.

27. The method of claim 26, further comprising the step of tracing back through the accumulated decisions so as to be able to determine a previous state of the signal encoded by the convolution encoder.

28. A circuit for increasing a decoding speed of a convolution decoder for decoding values of an initial signal which has been encoded into a plurality of states by a convolution encoder, comprising:

a circuit for generating a decision indicating which state of a plurality of possible states the convolution encoder was in before the current state;

means for establishing an R-bit complex decision comprising a combination of the decision and an accumulation of previous decisions, where R is less than a convergence length of the convolution encoder;

means for transferring, every R cycles, the R-bit decision to a storage area;

means for decoding the decisions in the storage area to determine the values of the initial signal.

* * * * *